(12) United States Patent
Tanaka et al.

(10) Patent No.: US 11,795,577 B2
(45) Date of Patent: Oct. 24, 2023

(54) SIC EPITAXIAL WAFER AND METHOD OF MANUFACTURING SIC EPITAXIAL WAFER

(71) Applicant: SHOWA DENKO K. K., Tokyo (JP)

(72) Inventors: Kensho Tanaka, Chichibu (JP); Yoshikazu Umeta, Chichibu (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 17/879,474

(22) Filed: Aug. 2, 2022

(65) Prior Publication Data

US 2023/0038132 A1   Feb. 9, 2023

(30) Foreign Application Priority Data

Aug. 4, 2021 (JP) .................. 2021-128273

(51) Int. Cl.
| | | |
|---|---|---|
| *C30B 29/36* | (2006.01) | |
| *H01L 29/16* | (2006.01) | |
| *H01L 29/167* | (2006.01) | |
| *H01L 21/02* | (2006.01) | |
| *C23C 16/44* | (2006.01) | |
| *C30B 25/20* | (2006.01) | |
| *C30B 25/16* | (2006.01) | |
| *C23C 16/32* | (2006.01) | |
| *C23C 16/52* | (2006.01) | |

(52) U.S. Cl.
CPC .......... *C30B 29/36* (2013.01); *C23C 16/325* (2013.01); *C23C 16/4408* (2013.01); *C23C 16/52* (2013.01); *C30B 25/16* (2013.01); *C30B 25/205* (2013.01); *H01L 21/0262* (2013.01); *H01L 21/02378* (2013.01); *H01L 21/02532* (2013.01); *H01L 21/02579* (2013.01); *H01L 29/167* (2013.01); *H01L 29/1608* (2013.01)

(58) Field of Classification Search
CPC ........ C30B 29/36; C30B 25/16; C30B 25/205
See application file for complete search history.

(56) References Cited

U.S. PATENT DOCUMENTS

| | | | |
|---|---|---|---|
| 2008/0035632 A1 | 2/2008 | Fujita et al. | |
| 2014/0284619 A1* | 9/2014 | Nishio | ............. H01L 21/02378 257/77 |
| 2020/0157677 A1 | 5/2020 | Harashima et al. | |

FOREIGN PATENT DOCUMENTS

| | | |
|---|---|---|
| JP | 2005-109408 A | 4/2005 |
| JP | 2012-195355 A | 10/2012 |
| JP | 2013-021113 A | 1/2013 |
| JP | 2015-529015 A | 10/2015 |
| JP | 2016-171348 A | 9/2016 |
| JP | 2019-121690 A | 7/2019 |

(Continued)

OTHER PUBLICATIONS

Office Action issued in Japanese Patent Application No. 2021-128273 dated May 31, 2022.

*Primary Examiner* — Elizabeth E Mulvaney
(74) *Attorney, Agent, or Firm* — Sughrue Mion, PLLC

(57) ABSTRACT

A SiC epitaxial wafer includes a SiC substrate and an epitaxial layer laminated on the SiC substrate, wherein the epitaxial layer contains an impurity element which determines the conductivity type of the epitaxial layer and boron which has a conductivity type different from the conductivity type of the impurity element, and the concentration of boron is less than $1.0 \times 10^{14}$ cm$^{-3}$ at any position in the plane of the epitaxial layer.

7 Claims, 4 Drawing Sheets

(56) References Cited

FOREIGN PATENT DOCUMENTS

| | | |
|---|---|---|
| WO | 2006/008941 A1 | 1/2006 |
| WO | 2014/145286 A1 | 9/2014 |
| WO | 2018/193664 A1 | 10/2018 |

\* cited by examiner ial layer of SiC laminated on the SiC substrate, wherein the epitaxial layer contains an impurity element which determines the conductivity type of the epitaxial layer and boron which has a conductivity type different from the conductivity type of the impurity element, and the concentration of boron is less than $1.0 \times 10^{14}$ cm$^{-3}$ at any position in the plane of the epitaxial layer.

SIC EPITAXIAL WAFER AND METHOD OF MANUFACTURING SIC EPITAXIAL WAFER

BACKGROUND OF THE INVENTION

Field of the Invention

The present disclosure relates to a SiC epitaxial wafer and a method of manufacturing a SiC epitaxial wafer.
Priority is claimed on Japanese Patent Application No. 2021-128273, filed on Aug. 4, 2021, the content of which is incorporated herein by reference.

Description of Related Art

Silicon carbide (SiC) has an insulation breakdown electric field that is an order of magnitude larger than silicon (Si), a band gap that is three times larger than silicon (Si), and a thermal conductivity that is about three times higher than silicon (Si). Silicon carbide (SiC) is expected to be applied to power devices, high frequency devices, high temperature operation devices and the like.

In order to promote practical use of SiC devices, it is required to establish high-quality SiC epitaxial wafers and high-quality epitaxial growth techniques.

The SiC device is formed on a SiC epitaxial wafer. The SiC epitaxial wafer includes an SiC substrate and an epitaxial layer laminated on the SiC substrate. The SiC substrate is obtained by processing a bulk single crystal of SiC grown by a sublimation recrystallization method or the like. The epitaxial layer is formed by chemical vapor deposition (CVD) or the like, and serves as an active region of the device.

The epitaxial layer may have an impurity element which determines the conductivity type of the epitaxial layer and boron which has a conductivity type different from the conductivity type of the impurity element (for example, Patent Literatures 1~3). Boron may reduce the effective carrier concentration in the drift layer and may result in a shorter carrier lifetime of the bipolar device.

Since boron is contained in a member or the like used for manufacturing a SiC epitaxial wafer, it is difficult to completely remove it. If there is a portion with a high concentration of boron in the epitaxial layer, it is difficult to apply the portion to a device in general. The higher the proportion of the portion where the concentration of boron is high in the plane of the epitaxial wafer, the smaller the effective area that can be applied to the device in general. Patent Literatures 1-3 do not describe in-plane uniformity of boron concentration in an epitaxial layer.

CITATION LIST

Patent Literature

[Patent Literature 1]
 Japanese Unexamined Patent Application, First Publication No. 2019-121690
[Patent Literature 2]
 PCT International Publication No. 2006/008941
[Patent Literature 3]
 PCT International Publication No. 2018/193664

SUMMARY OF THE INVENTION

A first aspect of the present disclosure provides a SiC epitaxial wafer including a SiC substrate and an epitax- In the SiC epitaxial wafer according to the first aspect, the diameter may be 150 mm or more.

In the SiC epitaxial wafer according to the first aspect, the diameter may be 200 mm or more.

A second aspect of the present disclosure provides a method of manufacturing a SiC epitaxial wafer including a film-forming step of forming an epitaxial layer of SiC on a SiC substrate using a vertical furnace having a gas supply port above a mounting surface of the SiC substrate, wherein the film-forming step comprises a temperature raising step of raising the temperature to a film-forming temperature while changing the temperature raising speed in the order of a first temperature raising speed, a second temperature raising speed, and a third temperature raising speed, wherein the first temperature raising speed is faster than the second temperature raising speed, the second temperature raising speed is faster than the third temperature raising speed, and the first temperature raising speed is 100° C./min or more.

In the method of manufacturing a SiC epitaxial wafer according to the second aspect, in the mounting surface of the SiC substrate, the height position of the center may be 30 µm or more higher than the height position of the outer periphery at the film-forming temperature.

In the method of manufacturing a SiC epitaxial wafer according to the second aspect, in the film-forming step, a purge gas may be supplied from the back surface of the SiC substrate, and the purge gas may be supplied from a position 20 mm or more inside the outer periphery of the SiC substrate.

In the method of manufacturing a SiC epitaxial wafer according to the second aspect, the time required for the temperature raising step may be 300 seconds or more and 750 seconds or less.

DETAILED DESCRIPTION OF THE INVENTION

Hereinafter, this embodiment will be described in detail with reference to the drawings. The drawings used in the following description may show, for convenience's sake, the features of the present disclosure in enlarged form, and the dimensional proportions of the components may be different from those in practice. The materials, dimensions, and the like exemplified in the following description are only examples, and the present disclosure is not limited thereto, and the disclosure can be carried out by appropriately changing the gist thereof without changing it.

Figure 1:
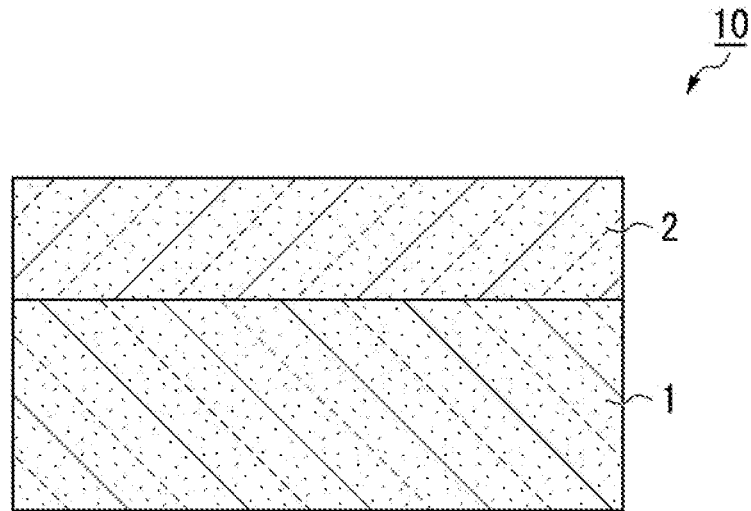
FIG. 1 is a cross-sectional view of a SiC epitaxial wafer according to the first embodiment.
Figure 2:
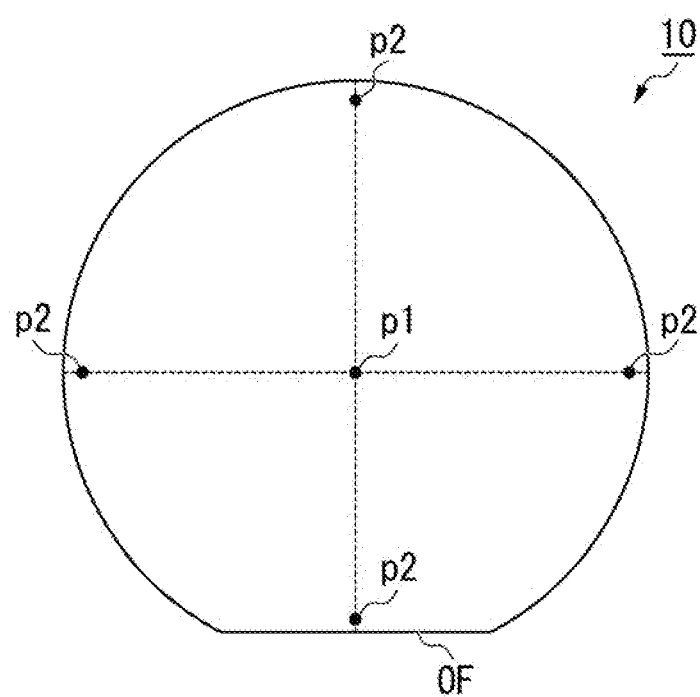
FIG. 2 is a plan view of the SiC epitaxial wafer according to the first embodiment.

FIG. 1 is a cross-sectional view of a SiC epitaxial wafer 10 according to the first embodiment. FIG. 2 is a plan view of the SiC epitaxial wafer 10 according to the first embodiment. The SiC epitaxial wafer 10 has a SiC substrate 1 and an epitaxial layer 2 thereon. The SiC epitaxial wafer 10 is, for example, a disk having a diameter of 150 mm or more. The diameter of the SiC epitaxial wafer 10 may be 200 mm or more.

The SiC substrate 1 is cut out from, for example, a SiC ingot. The SiC ingot is grown on a SiC seed crystal using, for example, a sublimation method. In the SiC substrate 1, for example, a surface having an offset angle in the <11-20> direction from (0001) is used as a growth surface. The SiC substrate 1 contains impurities. The impurity is, for example, nitrogen.

The SiC substrate 1 has, for example, a circular shape in plan view. The diameter of the SiC substrate 1 is, for example, 150 mm or more. A portion of the circle of the SiC substrate 1 may be cut off. The notched portion is referred to as the orientation flat OF. The orientation flat OF is used to confirm the orientation or the like of the SiC substrate 1.

The epitaxial layer 2 is laminated on the SiC substrate 1. The epitaxial layer 2 is formed by, for example, chemical vapor deposition (CVD). The epitaxial layer 2 is a single crystal film of SiC. The epitaxial layer 2 may be composed of, for example, a plurality of layers. For example, the epitaxial layer 2 may be composed of a plurality of SiC single crystal films having different impurity concentrations.

The epitaxial layer 2 includes an impurity element for determining a conductivity type of the epitaxial layer 2 and boron. The impurity element for determining the conductivity type is, for example, nitrogen. The conductivity type of nitrogen is n-type. The impurity concentration of the impurity determining the conductivity type of the epitaxial layer 2 is, for example, $1.0 \times 10^{14}$ cm$^{-3}$ or more and $3.0 \times 10^{16}$ cm$^{-3}$ or less, preferably $1.0 \times 10^{14}$ cm$^{-3}$ or more and $3.0 \times 10^{15}$ cm$^{-3}$ or less. The in-plane uniformity of the impurity concentration determining the conductivity type in the epitaxial layer 2 is preferably, for example, 20% or less, and more preferably 10% or less. The in-plane uniformity of the impurity concentration is obtained, for example, from the results of 10 or more measurement points in the radial direction passing through the center of the SiC epitaxial wafer. The in-plane uniformity of the impurity concentration determining the conductivity type is a value obtained by dividing the difference between the maximum value and the minimum value of the impurity concentration among the plurality of measurement points by the average value of the impurity concentration among the plurality of measurement points. The measurement points may be arranged in a direction parallel to the orientation flat OF, in a direction perpendicular to the orientation flat OF, or in directions parallel to and perpendicular to the orientation flat OF.

Boron shows a conductivity type different from that of nitrogen. The conductive type of boron is p-type. Boron is not intentionally doped in the epitaxial layer 2, but when the epitaxial layer 2 is formed, boron contained in a susceptor or the like in the film-forming apparatus is mixed as an impurity. Boron can cause a decrease in an effective carrier concentration and can also suppress the conductivity modulation effect of the bipolar device. The concentration of boron in the epitaxial layer 2 is preferably small, but it is difficult to completely remove boron.

The concentration of boron is less than $1.0 \times 10^{14}$ cm$^{-3}$ at any position in the plane of the epitaxial layer 2. The concentration of boron tends to be higher in the outer portion of the epitaxial layer 2 than on the center thereof. If the concentration of boron at the center p1 of the epitaxial layer 2 and at the four points p2 which are 5 mm inside from the outer periphery is within the above range, it can be regarded that the concentration of boron at any position in the plane is within the above range. Note that a range of 5 mm inside from the outer periphery may often not be regarded as an effective area of the device. Therefore, the range of 5 mm inside from the outer periphery is often negligible.

The concentration of impurities and boron in each layer can be measured by, for example, a mercury probe (Hg-CV) method or secondary ion mass spectrometry (SIMS).

In the Hg-CV method, the difference (Nd−Na) between the donor concentration Nd and the acceptor concentration Na is measured as an n-type impurity concentration. If the acceptor concentration is sufficiently small compared to the donor concentration, the difference between these concentrations can be regarded as the n-type impurity concentration.

Secondary ion mass spectrometry (SIMS) is a method of performing mass spectrometry on secondary ions that have popped out while dogging a layer in the thickness direction. The doping concentration can be measured from mass spectrometry.

The measurement points of the impurity and boron concentrations may be any points as long as the distribution in the wafer surface can be reflected. Preferably, points less than 5 mm from the edge of the wafer are not included in the measurement points. For example, a plurality of points are measured in the cross direction with the center of the wafer as the origin. For example, in the case of a 6 inch wafer, measurements are made at a total of 21 points consisting of 5 points in each of the 4 directions of the cross with the origin at the center of the wafer.

Next, a method of manufacturing a SiC epitaxial wafer according to the first embodiment will be described. First, an SiC substrate 1 is prepared. The SiC substrate 1 is obtained by cutting the SiC ingot with a predetermined thickness. The SiC substrate 1 may be purchased for sale.

Next, a film-forming step of forming an epitaxial layer 2 on the SiC substrate 1 is performed. The epitaxial layer 2 is formed by, for example, CVD.

Figure 3:
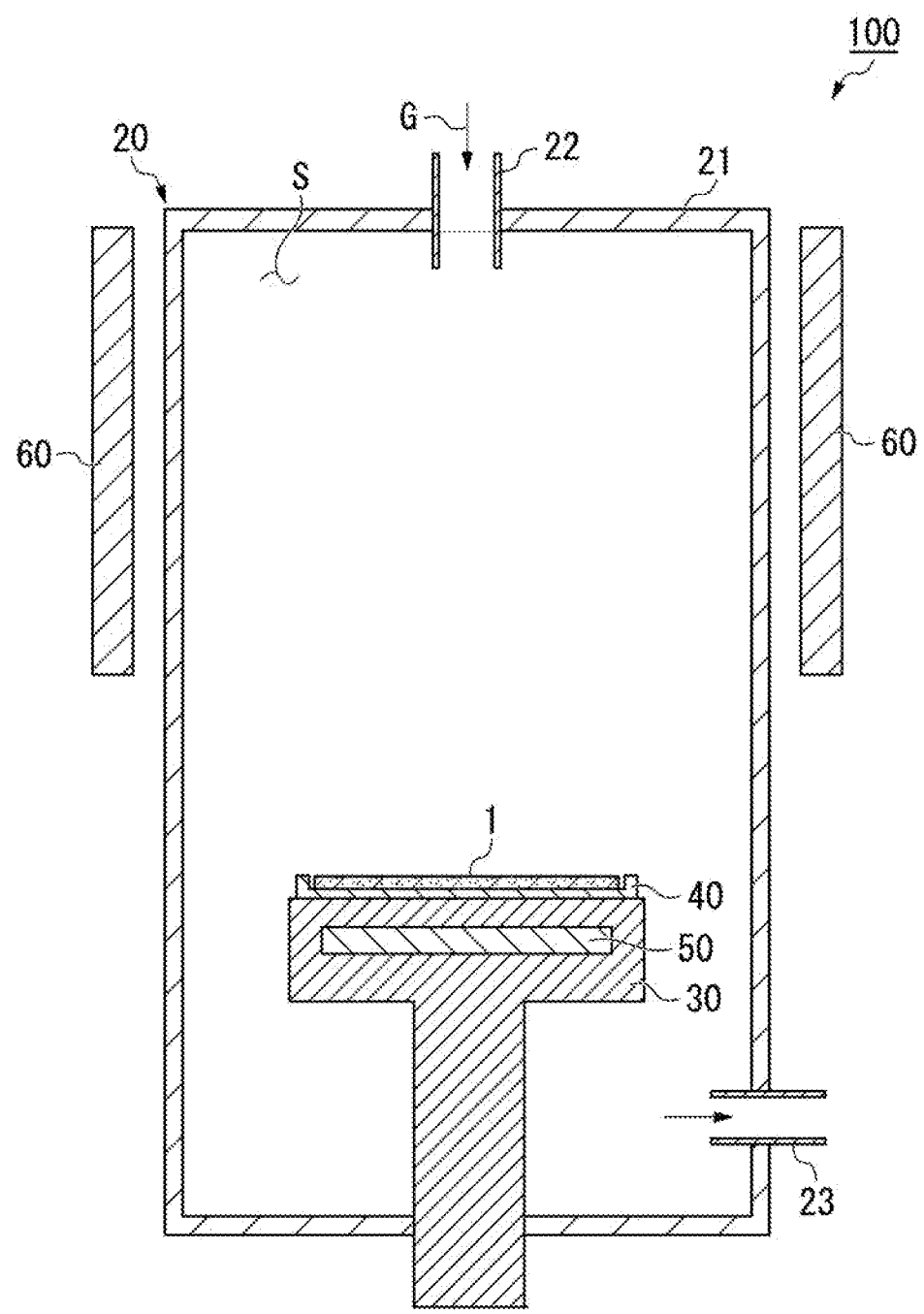
FIG. 3 is a schematic view of a film-forming apparatus for the SiC epitaxial wafer according to the first embodiment.

FIG. 3 is a schematic view of an example of a film-forming apparatus 100 for a SiC epitaxial wafer 10 according to the first embodiment. The film-forming apparatus 100 includes, for example, a chamber 20, a support 30, a susceptor 40, a lower heater 50, and an upper heater 60. FIG. 3 shows a state in which the SiC substrate 1 is mounted on the susceptor 40. The film-forming apparatus 100 is a vertical furnace having a gas supply port 22 above the mounting surface of the SiC substrate 1.

The chamber 20 has, for example, a body 21, a gas supply port 22, and a gas discharge port 23. The main body 21 surrounds the film-forming space S. The gas supply port 22 is an inlet for supplying the film-forming gas G to the film-forming space S. The gas supply port 22 is located, for example, above the mounting surface of the SiC substrate 1. The gas discharge port 23 is an outlet for discharging the film-forming gas G and the like retained in the film-forming space S. The gas discharge port 23 is located, for example, below the mounting surface of the SiC substrate 1. The film-forming gas G is, for example, a Si-based gas, a C-based gas, a purge gas, and a dopant gas.

The Si-based gas is a source gas containing Si in the molecule. The Si-based gas is, for example, silane (SiH$_4$), dichlorosilane (SiH$_2$Cl$_2$), trichlorosilane (SiHCl$_3$), tetrachlorosilane (SiCl$_4$) or the like. The C-based gas is, for example, propane (C$_3$H$_8$), ethylene (C$_2$H$_4$) or the like. The dopant gas is a gas containing an element serving as a carrier. The dopant gas is, for example, nitrogen, ammonia or the like. The purge gas is a gas for conveying these gases to the SiC substrate 1, and is hydrogen or the like that is inert to SiC.

The support 30 supports the SiC substrate 1. The support 30 is rotatable about an axis. The SiC substrate 1 is placed on the support 30, for example, in a state where the SiC substrate 1 is mounted on the susceptor 40. The susceptor 40 is conveyed into the chamber 20 with the SiC substrate 1 mounted thereon. The lower heater 50 is provided, for example, in the support 30 and heats the SiC substrate 1. An upper heater 60 heats the upper part of the chamber 20. The member exposed in the film-forming space S is, for example, a carbon member, and its surface may be coated with SiC or TaC.

Figure 4:
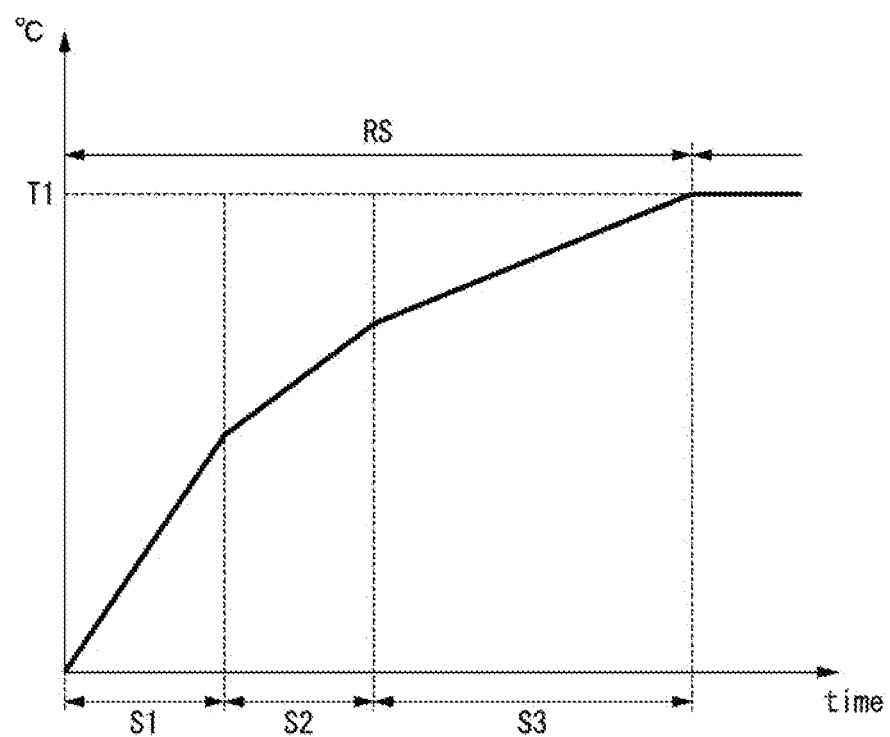
FIG. 4 is an example of the film-forming process of the SiC epitaxial wafer according to the first embodiment.

The film-forming step is performed, for example, in a vertical furnace shown in FIG. 3. FIG. 4 is an example of a manufacturing process of the SiC epitaxial wafer 10 according to the first embodiment. The film-forming step includes a temperature raising step RS for raising the temperature to the film-forming temperature T1. After the temperature raising step, the film-forming temperature T1 is maintained to form the epitaxial layer 2. The film-forming temperature T1 is, for example, 1500° C. or more.

The time required for the temperature raising step RS is, for example, 300 seconds or more and 750 seconds or less. When the time required for the temperature raising process RS is short, the strain of the SiC substrate 1 and the susceptor 40 increases, and the in-plane uniformity of the epitaxial layer 2 deteriorates. In addition, if the time required for the temperature raising process RS is short, the film-forming gas is rolled back due to convection caused by the temperature difference in the plane of the susceptor 40, and boron discharged from the susceptor 40 is taken into the wafer. When the time required for the temperature raising process RS is long, the amount of boron discharged from the member used in the film-forming apparatus 100 increases.

The temperature raising step RS includes, for example, a first temperature raising step S1, a second temperature raising step S2, and a third temperature raising step S3. The first temperature raising step S1, the second temperature raising step S2, and the third temperature raising step S3 have different temperature raising speeds. In the temperature raising step RS, the temperature raising speed may be changed twice or more, and further steps having different temperature raising speeds such as a fourth temperature raising step and a fifth temperature raising step may be included.

In the first temperature raising step S1, the temperature is raised at a first temperature raising speed. The first temperature rising speed is 100° C./min or more. The first temperature raising speed is faster than the second temperature raising speed in the second temperature raising step S2. In the first temperature raising step S1, the temperature is raised to, for example, about 1200° C.

The second temperature raising step S2 is performed after the first temperature raising step S1 and before the third temperature raising step S3. The second temperature raising step S2 is performed at a second temperature raising speed. The second temperature raising speed is slower than the first temperature raising speed and faster than the third temperature raising speed. The second temperature rising speed is, for example, 90% or less of the first temperature rising speed. In the second temperature raising step S2, the temperature is raised to, for example, about 1400° C.

The third temperature raising step S3 is performed after the second temperature raising step S2. The third temperature raising step S3 is performed at a third temperature raising speed. The third temperature raising speed is slower than the second temperature raising speed. The third temperature raising speed is, for example, 90% or less of the second temperature raising speed.

The time required for the entire temperature raising process RS can be shortened by increasing the first temperature raising speed. When the time required for the entire temperature raising process RS becomes shorter, the amount of boron released from the film-forming apparatus 100 is reduced. Further, by gradually slowing down the temperature raising speed, it is possible to suppress the strain of the SiC substrate 1 and the susceptor 40 from becoming too large.

Figure 5:
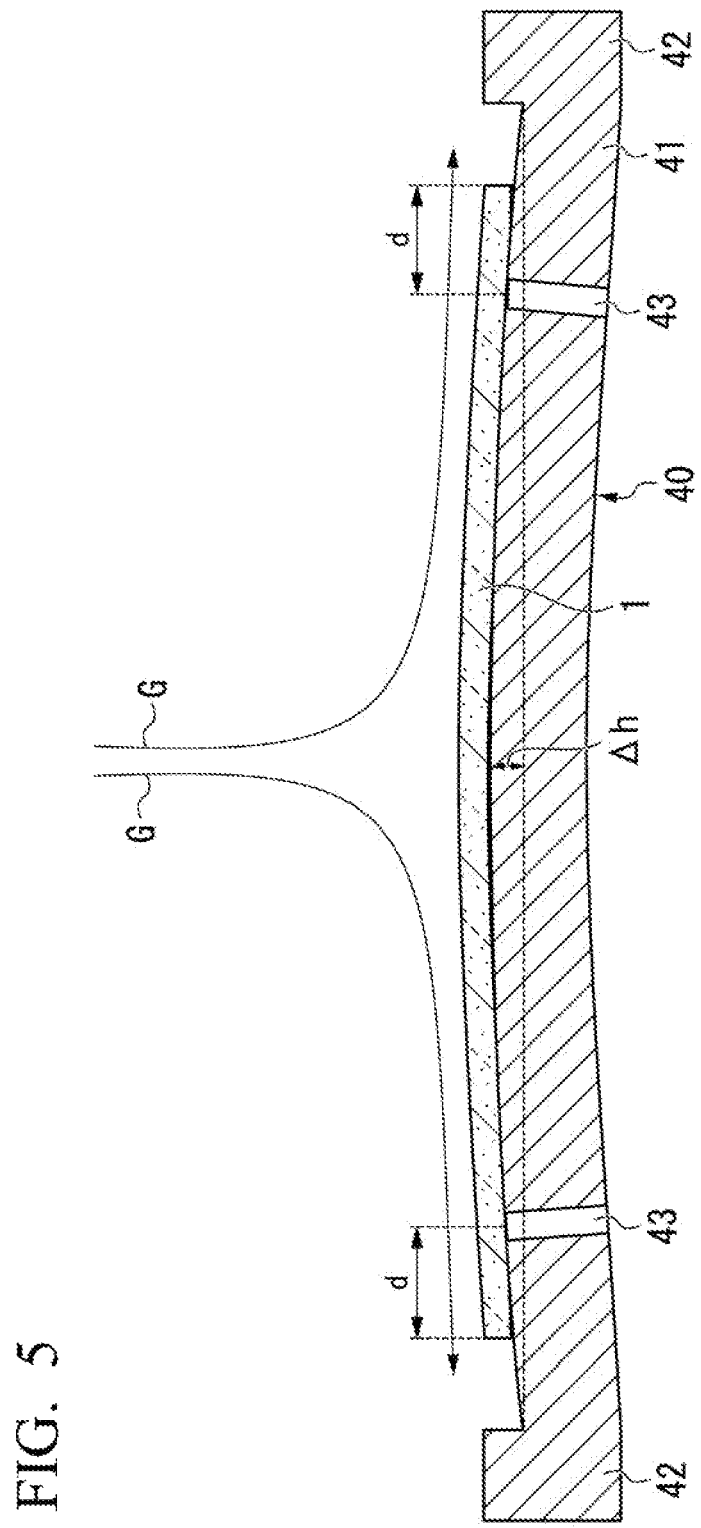
FIG. 5 is an enlarged view of the vicinity of the SiC substrate of the film-forming apparatus for the SiC epitaxial wafer according to the first embodiment.

FIG. 5 is an enlarged view of the vicinity of the SiC substrate 1 in the film-forming apparatus for the SiC epitaxial wafer according to the first embodiment. The SiC substrate 1 is placed on a susceptor 40. The susceptor 40 has, for example, a support portion 41, an outer peripheral portion 42, and a through hole 43.

The SiC substrate 1 is mounted on the support portion 41. The outer peripheral portion 42 prevents the SiC substrate 1 from protruding to the outside during film formation. The outer peripheral portion 42 may be, for example, a separate ring-shaped member. The through hole 43 is a hole connecting the upper surface and the lower surface of the support portion 41.

The difference between the height position of the center of the mounting surface of the SiC substrate 1 and the height position of the outermost periphery is referred to as the height difference Δh. The height difference Δh can be measured by, for example, a laser displacement meter. First, a measurement port and a laser displacement meter are installed at the center and the outer periphery portion of the susceptor at the upper part of the furnace, and the warpage of the susceptor is measured by determining the difference in height between the center portion and the outer periphery portion at the film-forming temperature without installing a wafer. Then, a wafer is mounted on the susceptor, and the measurement is performed under the same conditions as when the warpage is measured without mounting the wafer, so that the height difference Δh can be measured. By forming the film while measuring the height difference Δh, an arbitrary height difference Δh can be maintained. Further, by selecting the wavelength of the laser light source, the warpage of the susceptor can be measured while the wafer is mounted. For example, in the case of a SiC wafer, when the wavelength of the laser light source is 600 nm or more, the laser passes through the SiC wafer, so that the warpage of the susceptor can be measured while the wafer is mounted. The height difference Δh at the time of film-forming is preferably 30 μm or more. That is, at the film-forming temperature T1, the height position of the center of the mounting surface of the SiC substrate 1 is preferably 30 μm or more higher than the height position of the outermost periphery. The height difference Δh at the film-forming temperature T1 is preferably 100 μm or less.

The range of the height difference Δh may be satisfied as long as it is satisfied at the film-forming temperature T1, and may not be satisfied at the ordinary temperature. When there is an outer peripheral portion 42, the boundary between the outer peripheral portion 42 and the mounting surface is the outermost periphery of the mounting surface.

The height difference Δh can be controlled by, for example, a film-forming condition. The difference Δh tends to increase as the temperature raising speed is fast. In addition, the height difference Δh may be adjusted by the material constituting the susceptor 40. For example, the susceptor 40 may be made of two or more materials having different coefficients of thermal expansion, and the difference in height Δh may be adjusted using the difference in the coefficients of thermal expansion.

When the height difference Δh becomes large, the film-forming gas G flows from the center of the SiC substrate 1 to the outside in the vicinity of the upper surface of the SiC substrate 1, and it is possible to prevent the film-forming gas G from rolling back or the like. The rewinding of the film-forming gas G causes boron and unreacted gas released from the susceptor 40 or the like to be taken into the epitaxial layer 2. When the flow of the film-forming gas G from the center to the outside of the SiC substrate 1 is formed in the vicinity of the upper surface of the SiC substrate 1, the concentration of boron contained in the epitaxial layer 2 is lowered. If the height difference Δh is within a predetermined range, the difference in the film-forming conditions between the center and the outer peripheral portion of the epitaxial layer 2 is small, and the in-plane uniformity of the epitaxial layer 2 is enhanced.

Gas may be supplied to the back surface of the SiC substrate 1 via the through hole 43. The gas supplied to the back surface side of the SiC substrate 1 prevents the film-forming gas G from flowing into the back surface of the SiC substrate 1. The gas supplied to the back surface is a purge gas that is inert to SiC.

The purge gas is preferably supplied toward the back surface of the SiC substrate 1 from a position 20 mm or more inside the outermost periphery of the SiC substrate 1. For example, the distance d between the through hole 43 and the outermost periphery is preferably 20 mm or more. When the supply position of the purge gas to the back surface of the SiC substrate 1 satisfies the above condition, the flow of the film-forming gas G can be suppressed from being disturbed by the purge gas from the back surface.

Through the above process, a SiC epitaxial wafer 10 having a boron concentration of $1.0 \times 10^{14}$ cm$^{-3}$ or less at any position in the plane is produced.

Since the concentration of boron in the SiC epitaxial wafer 10 according to the present embodiment is $1.0 \times 10^{14}$ cm$^{-3}$ or less, the carrier lifetime after device processing can be prolonged. If the carrier lifetime is long, a sufficient conductivity modulation effect can be obtained in the bipolar device.

The lower the impurity concentration determining the conductivity type of the epitaxial layer 2, the greater the effect is. For example, when the concentration of nitrogen is $1.0 \times 10^{15}$ cm$^{-3}$ and the concentration of boron is $1.0 \times 10^{14}$ cm$^{-3}$ in the epitaxial layer 2, boron occupies a ratio of 10% to nitrogen for determining the conductivity type. In this case, the adverse effect caused by the presence of boron increases. In other words, in the epitaxial layer 2 having a low impurity concentration for determining the conductivity type, it is valuable to have a low concentration of boron.

Although preferred embodiments of the present disclosure have been described in detail above, the present disclosure is not limited to specific embodiments, and various modifications and modifications can be made within the scope of the subject matter of the present disclosure described in the claims.

EXAMPLES

Example 1

SiC substrates of 150 mm in diameter were prepared. The epitaxial layer 2 was formed on the SiC substrate 1 using a vertical furnace similar to the film-forming apparatus 100 shown in FIG. 3. The temperature raising step was divided into three steps, and the temperature raising speed was changed twice. The first temperature raising speed was 100° C./min or more. The second temperature raising speed was set to be less than 80% of the first temperature raising speed. The third temperature raising speed was set to be less than 80% of the second temperature raising speed. The film-forming temperature was 1600° C. or higher and less than 1700° C. The time required for temperature rise was 300 seconds or more and less than 750 seconds.

When the epitaxial layer 2 was formed, purge gas was supplied from the back surface side of the SiC substrate 1. The purge gas was supplied so as to hit a position 20 mm or more inside the outer periphery of the SiC substrate 1. In the temperature range of 1600° C. or higher and less than 1700° C., the height position of the center of the mounting surface of the SiC substrate 1 was set to be 30 μm or more higher than the height position of the outermost periphery.

After production, the concentration of boron at the center p1 of the SiC epitaxial wafer 10 and the concentration of boron at four points p2 which are 5 mm inside from the outer periphery were measured. The concentration of boron at the center p1 of Example 1 was $5.0 \times 10^{13}$ cm$^{-3}$, and the boron concentration at the point p2 was $9.0 \times 10^{13}$ cm$^{-3}$. Therefore, the SiC epitaxial wafer according to Example 1 had a boron concentration of less than $1.0 \times 10^{14}$ cm$^{-3}$ at any position in the plane.

Comparative Example 1

SiC substrates of 150 mm in diameter were prepared. In Comparative Example 1, a horizontal furnace having a gas supply port on the side of the SiC substrate was used. Then, an epitaxial layer 2 was formed on the SiC substrate 1 using a horizontal furnace. The temperature raising process was one step, and the temperature raising speed was not changed. The temperature raising speed was set to 100° C./min or less. The film-forming temperature was 1600° C. or higher and less than 1700° C. The time required for temperature rise was more than 750 seconds.

In the comparative example, no purge gas was supplied to the back surface side of the SiC substrate 1. Since the temperature raising speed is slower than that of the Example, the height position of the center of the mounting surface of the SiC substrate 1 was less than 30 μm from the height position of the outermost periphery in a temperature range of 1600° C. or higher and less than 1700° C.

After production, the concentration of boron at the center p1 of the SiC epitaxial wafer of Comparative Example 1 and the concentration of boron at four points p2 which are 5 mm inside from the outer periphery were measured. The concentration of boron at the center p1 of Comparative Example 1 was $9.2 \times 10^{14}$ cm$^{-3}$, and the concentration of boron at the point p2 was $8.1 \times 10^{13}$ cm$^{-3}$. Therefore, the SiC epitaxial wafer according to Comparative Example 1 had portions where the concentration of boron was $1.0 \times 10^{14}$ cm$^{-3}$ or more.

What is claimed is:
1. A SiC epitaxial wafer, comprising:
 a SiC substrate; and, an epitaxial layer of SiC laminated on the SiC substrate, wherein the epitaxial layer contains an impurity element which determines the conductivity type of the epitaxial layer and boron which has a conductivity type different from the conductivity type of the impurity element, and the concentration of boron is less than $1.0 \times 10^{14}$ cm$^{-3}$ at any position in the plane of the epitaxial layer.

2. The SiC epitaxial wafer according to claim 1, wherein the diameter is 150 mm or more.

3. The SiC epitaxial wafer according to claim 1, wherein the diameter is 200 mm or more.

4. A method of manufacturing a SiC epitaxial wafer, comprising:
   a film-forming step of forming an epitaxial layer of SiC on a SiC substrate using a vertical furnace having a gas supply port above a mounting surface of the SiC substrate, wherein the film-forming step comprises a temperature raising step of raising the temperature to a film-forming temperature while changing the temperature raising speed in the order of a first temperature raising speed, a second temperature raising speed, and a third temperature raising speed, wherein the first temperature raising speed is faster than the second temperature raising speed, the second temperature raising speed is faster than the third temperature raising speed, and the first temperature raising speed is 100° C./min or more.

5. A method of manufacturing a SiC epitaxial wafer according to claim 4, wherein in the mounting surface of the SiC substrate, the height position of the center is 30 μm or more higher than the height position of the outer periphery at the film-forming temperature.

6. A method of manufacturing a SiC epitaxial wafer according to claim 4, wherein in the film-forming step, a purge gas is supplied from the back surface of the SiC substrate, and the purge gas is supplied from a position 20 mm or more inside the outer periphery of the SiC substrate.

7. A method of manufacturing a SiC epitaxial wafer according to claim 4, wherein the time required for the temperature raising step is 300 seconds or more and 750 seconds or less.

* * * * *